United States Patent [19]

Kodama

[11] Patent Number: 5,267,195
[45] Date of Patent: Nov. 30, 1993

[54] SEMICONDUCTOR NON-VOLATILE MEMORY DEVICE

[75] Inventor: Noriaki Kodama, Tokyo, Japan

[73] Assignee: NEC Corporation, Tokyo, Japan

[21] Appl. No.: 775,463

[22] Filed: Oct. 15, 1991

[30] Foreign Application Priority Data

Oct. 15, 1990 [JP] Japan .................. 2-275942

[51] Int. Cl.⁵ .................. H01L 29/78; G11C 17/00
[52] U.S. Cl. .................. 365/185; 257/314; 257/326
[58] Field of Search ............ 365/185; 357/23.5, 23.7; 257/314, 326

[56] References Cited

U.S. PATENT DOCUMENTS

| 4,964,080 | 10/1990 | Tzeng | 357/23.5 |
| 5,057,885 | 10/1991 | Matsumoto et al. | 357/23.5 |

FOREIGN PATENT DOCUMENTS 60-182162  9/1985  Japan .
61-194877  8/1986  Japan .
59-121880  7/1989  Japan .

OTHER PUBLICATIONS

Patent Abstracts of Japan, vol. 10, No. 248, Aug. 26, 1986.
Patent Abstracts of Japan, vol. 12, No. 150, May 10, 1988.

Primary Examiner—Eugene R. LaRoche
Assistant Examiner—Viet Q. Nguyen
Attorney, Agent, or Firm—Sughrue, Mion, Zinn, Macpeak & Seas

[57] ABSTRACT

A semiconductor non-volatile memory device with a memory cell has a memory transistor formed on a semiconductor substrate and a select transistor composed of a thin film transistor provided on an upper surface of the memory transistor and connected in series with the memory transistor. The space occupied by the memory cell is that of one transistor whereby the size of the overall memory cell can be made smaller.

8 Claims, 2 Drawing Sheets

SEMICONDUCTOR NON-VOLATILE MEMORY DEVICE

BACKGROUND OF THE INVENTION (1) Field of the Invention

The present invention relates to a semiconductor non-volatile memory device and, more particularly, to a semiconductor non-volatile memory device in which stored digital information (or data) in terms of bits (binary digits) is electrically erasable.

(2) Description of the Related Art

As a typical semiconductor non-volatile memory device in which the stored data can be electrically erased, there is a Flotox (Floating-gate Tunnel Oxide) type memory cell. This Flotox type memory cell has a configuration as shown in FIG. 1.

On a semiconductor substrate 1, there are formed a memory transistor 17 equipped with a floating-gate 10 and a select transistor 19 with a drain diffusion layer 4 of the memory transistor 17 and a source diffusion layer 20 of the select transistor 19 being connected with each other at a node region 18.

Erasing of the data stored in the memory cell is carried out in the following way. A select gate 12 of the select transistor 19 is set to a high potential, for example, 20 V and a control gate 11 of the memory transistor 17 is set to a high potential, for example, 20 V, and further by grounding a source diffusion layer 3 of the memory transistor 17, a drain diffusion layer 21 of the select transistor 19 and the semiconductor substrate 1, the injection of electrons is performed from the drain diffusion layer 4 of the memory transistor 17 to the floating gate 10 through a tunnel insulating film 7 of a tunnel region 5 by Fowler-Nordheim tunneling action.

Next, the writing (storing) of the data in the memory cell is performed in the following ways. The drain diffusion layer 21 of the select transistor 19 is set to a high potential, for example, 20 V and the select gate 12 is applied with a voltage of, for example, 5 V, whereby the select transistor 19 turns to its ON-state. Next, the control gate 11 of the memory transistor 17 is grounded and, by placing the source diffusion layer 3 in its floating potential state, a high potential close to 20 V is thus applied to the drain diffusion layer 4 of the memory transistor 17, whereby the electrons are emitted from the floating gate 10 through the tunnel insulating film 7 of the tunnel region 5 by Fowler-Nordheim tunneling action.

In the conventional Flotox type memory device described above, since a high voltage is applied to the drain diffusion layer 21 of the select transistor 19 during the writing-in operation, it is necessary that the drain diffusion layer 21 be made sufficiently thick so as to be highly resistive to the high voltage applied thereto. For this reason, it is difficult to realize the short channeling of the select gate 12 of the select transistor and to make the memory cell smaller.

SUMMARY OF THE INVENTION

It is, therefore, a primary object of the invention to provide a semiconductor non-volatile memory device which overcomes the above explained problems in the conventional memory device, and to provide an improved semiconductor non-volatile memory device whose select gate is short-channeled and which is small.

According to one aspect of the invention, there is provided a semiconductor non-volatile memory device comprising:

a semiconductor substrate;

a memory transistor formed on the semiconductor substrate; and a select transistor composed of a thin film transistor provided on an upper surface of the memory transistor and connected in series with the memory transistor.

According to the invention, since add semiconductor non-volatile memory device having the memory transistor on the semiconductor substrate has the select transistor composed of the thin film transistor provided on the upper surface of the memory transistor and connected in series with the memory transistor, the size of memory can be made small.

The select transistor is the thin film transistor which is formed on the upper surface of the memory transistor with the insulating film lying between them by, for example, polycrystalline silicon thin film. The source diffusion layer of the select transistor is provided in contact with the drain diffusion layer of the memory transistor and these transistors are connected in series.

Therefore, the size of the memory cell is only the size of the memory transistor thereby enabling to make the memory cell area smaller.

The memory transistor to be used may be of any type as long as data can be electrically written and erased therein, for example, a floating-gate type or a multi-layer gate insulating film type. Instead of providing the select gate of the select transistor independently, such gate may be in common with the control gate of the memory transistor. Further, the thin film transistor may be formed by, for example, polycrystalline silicon.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Now, an explanation is made on embodiments of the invention with reference to the accompanying drawings.

It should be noted that, throughout the following explanation, similar reference symbols or numerals refer to the same or similar elements in all the figures of the drawings.

Figure 2:
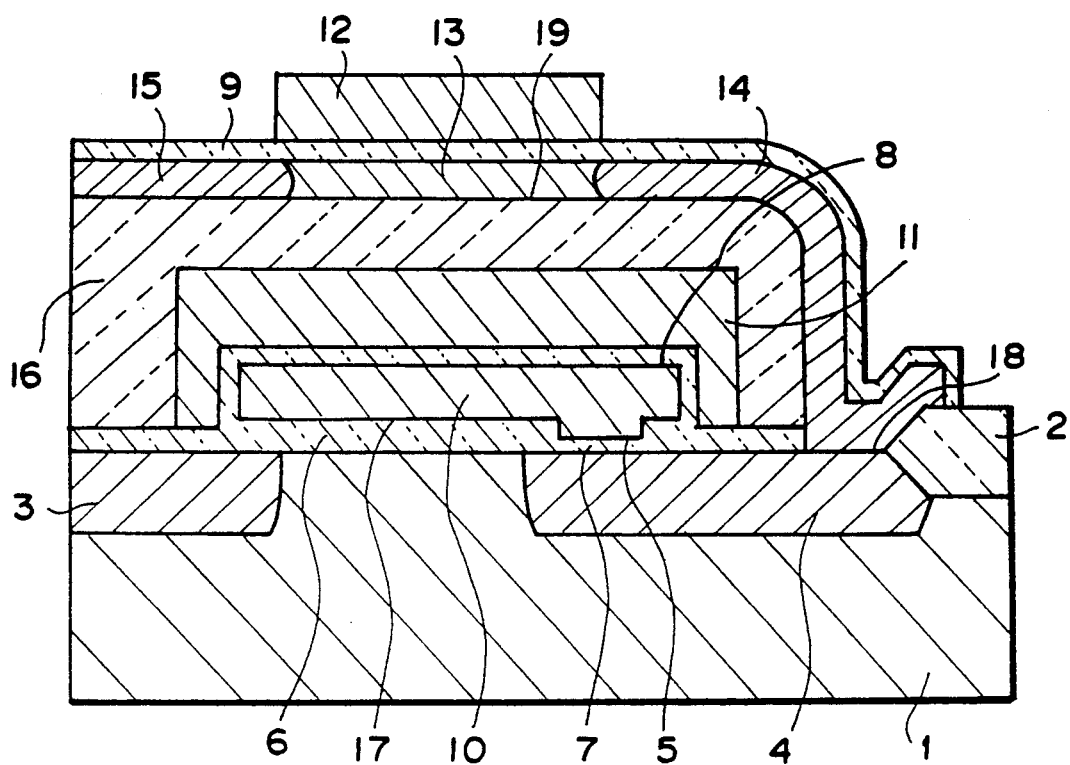
FIG. 2 is a diagrammatic sectional view showing the device of a first embodiment according to the invention.

FIG. 2 is a diagrammatic sectional view showing a non-volatile memory device of a first embodiment according to the present invention.

In the first embodiment, a memory transistor 17 having a floating gate 10 is formed on a semiconductor substrate 1. On an interlaid insulating film 18 over the memory transistor 17, a select transistor 19 is formed in a polycrystalline silicon thin film 13, and a drain diffusion layer 4 of the memory transistor 17 and a source diffusion layer 14 of the select transistor 19 are connected with each other at a node region 18.

Here, the thickness of the polycrystalline silicon thin film 13 constituting the select transistor 19 is made approximately 1000 Å, and the impurity concentration of the drain diffusion layer 15 of the select transistor 19 is made in the order of approximately $10^{18} \sim 10^{19}$ cm$^{-2}$, whereby it is possible to elevate the resisting voltage of the drain diffusion layer 15 to higher than about 20 V.

In FIG. 2, the reference numeral 2 denotes an element separation insulating film; 3 denotes the source diffusion layer of the memory transistor 17; 5 denotes the tunnel region; 6 denotes a first gate insulating layer; 7 denotes the tunnel insulating layer; 8 denotes a second gate insulating film; 9 denotes a third gate insulating film; 11 denotes the control (regular) gate; 12 denotes the select gate; and 15 denotes the drain diffusion layer of the select transistor 19.

The feature in the first embodiment according to the invention shown in FIG. 2 is that the select transistor 19 is formed on the memory transistor 17 in the form of a thin film transistor.

Next, an explanation is made on the operation of the device of the first embodiment.

Figure 1:
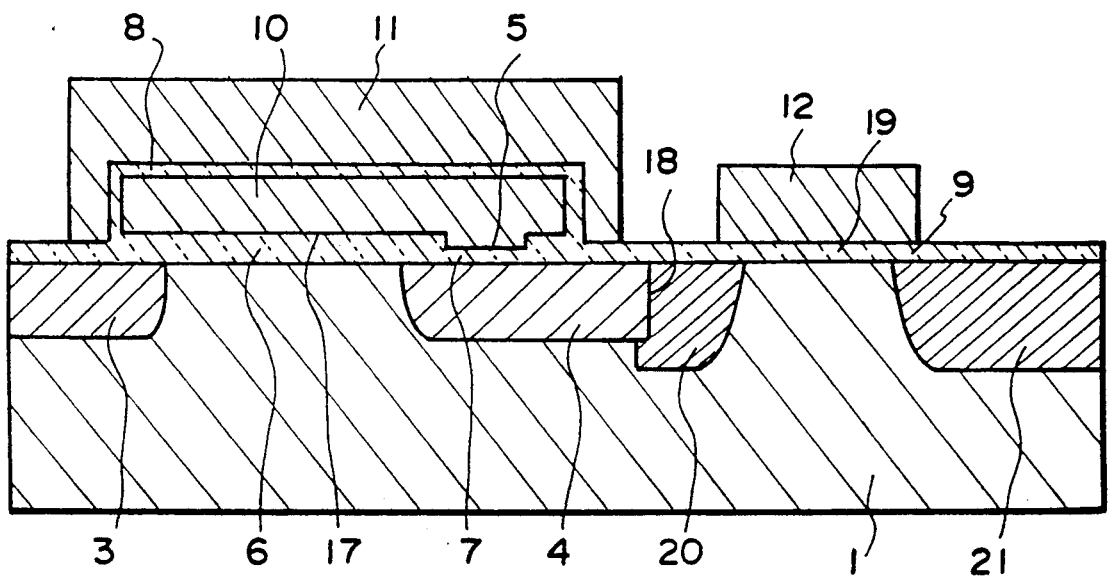
FIG. 1 is a diagrammatic sectional view showing the semiconductor non-volatile memory device of the prior art.

Erasing and writing of the data in the memory cell is performed in the same way as in the conventional Flotox type memory cell explained above with reference to FIG. 1.

Specifically, the stored data is erased when the memory transistor 17 injects electrons to the floating gate 10 by Fowler-Nordheim tunneling action from the drain diffusion layer 4 through the tunnel region 5, and the data are written-in when the memory transistor 17 emits electrons from the floating gate 10 through the tunnel region 5 by Fowler-Nordheim tunneling action.

The explanation has been made on the memory cell of the Flotox type but it is to be understood that the present invention can be embodied in memory transistors having memory cells of other types.

Figure 3:
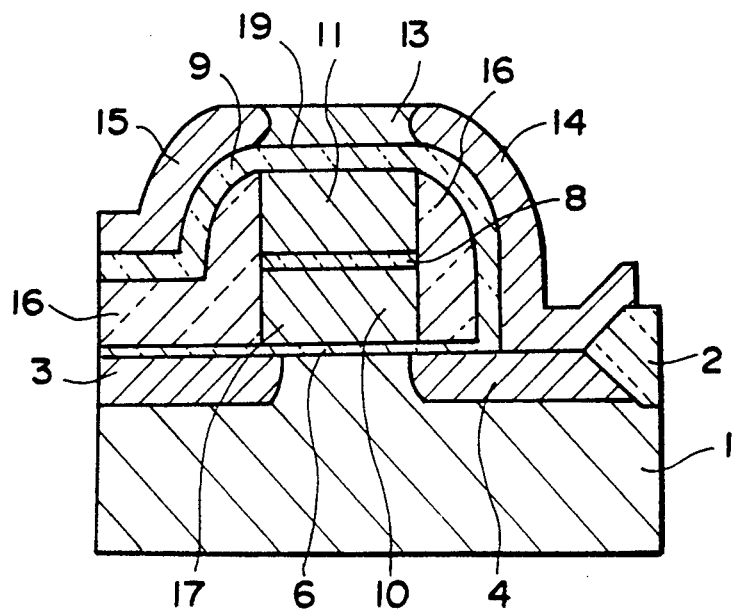
FIG. 3 is a diagrammatic sectional view showing the device of a second embodiment according to the invention.

FIG. 3 diagrammatically shows a second embodiment of the invention, which has a different type transistor as the memory transistor.

In this second embodiment, as a memory transistor of different type, there is a floating gate but the write-in operation is effected by having electrons injected to this floating gate by channel hot electron injection and the erasing operation is effected by having a high voltage applied to the source diffusion layer of the memory transistor and by having electrons emitted from the floating gate to the source diffusion layer through the gate oxide film by Fowler-Nordheim tunneling action.

In the second embodiment, the memory transistor 17 is formed on the semiconductor substrate 1 with the first gate insulating film 6, the floating gate 10, the second gate insulating film 8, and the control or regular gate 11 being placed in its order one over another and a source diffusion layer 3 and a drain diffusion layer 4 are formed in the upper surface of the semiconductor substrate 1 with the floating gate 10 being positioned at a mid-point between the source diffusion layer 3 and the drain diffusion layer 4.

The interlaid insulating film 16 is formed in such a way that an upper surface of the control gate 11 of the memory transistor 17 is exposed. The select transistor 19 is constituted such that a polycrystalline silicon thin film 13 is formed on the third gate insulating film 9 covering the interlaid insulating film 16 and also the upper surface of the control gate 11, and a source diffusion layer 14 and a drain diffusion layer 15 are formed in the polycrystalline thin film 13 with the control gate 11 being positioned in the middle between the source diffusion layer 14 and the drain diffusion layer 15.

In the above arrangement, the control gate 11 of the memory transistor 17 and the select gate of the select transistor 19 are in common.

The feature of this arrangement is that, the select transistor 19 in the form of a thin film transistor is formed on the memory transistor 17 in such a manner that the control gate 11 of the memory transistor serves also as the select gate of the select transistor 19.

Next, an explanation is made on the operation of the device of the second embodiment.

The writing of data in the memory cell is effected in the following manner. The control gate 11 of the memory transistor 17 is made a high potential, for example, 15 V so as to cause both the memory transistor 17 and the select transistor 19 to turn ON, the source diffusion layer 3 of the memory transistor 17 is grounded and the drain diffusion layer 15 of the select transistor 19 is made a high potential, for example, 10 V so that the memory transistor 17 operates at its saturated state, and the channel hot electrons produced then are injected to the floating gate 10. By this writing-in operation, the threshold voltage of the memory transistor 17 is shifted to and set at a high value (logic 1), for example, 8 V.

The operation for erasing the memory (stored data) is effected in the following way. The control gate 11 of the memory transistor 17 is grounded, the drain diffusion layer 4 of the memory transistor 17 is made in a floating potential state and the source diffusion layer 3 of the memory transistor 17 is applied with a high voltage, for example, a voltage in the order of 15 V, so that electrons are emitted from the floating gate 10 of the memory transistor 17 through the first gate insulating film 6 by Fowler-Nordheim tunneling action. By this erasing operation, the threshold voltage of the memory transistor 17 is shifted to and set at a low value (logic 0) lower than about 3 V, for example.

Also, the operation for retrieving (reading-out) the data in the memory is effected in the following way. The control gate 11 of the memory transistor 17 is applied, for example, 5 V, the source diffusion layer 3 of the memory transistor 17 is grounded, and the drain diffusion layer 15 of the select transistor 19 is applied with a voltage in the order of 1 V. The written-in state of the memory transistor 17 is judged or detected by whether the current flows or not.

In the memory transistor of the type described as the second embodiment in which the data are written-in by the channel hot electron injection and the data are erased by having electrons emitted from the floating gate by Fowler-Nordheim tunneling action, the memory transistor can operate without the provision of a select transistor if the condition given below is satisfied.

That is, the circuit is one in which the threshold voltage of the memory transistor after the erasing of data stored in the memory can be set to an enhancement mode transistor having a voltage of low absolute value.

However, in practice, when the electrons are emitted from the floating gate by Fowler Nordheim tunneling action, the floating gate is injected with positive holes at the same time and, after the erasing of the memory, the memory transistor becomes that of depletion mode. Thus, this results in the problem that the selection of a memory cell cannot be effected at the reading-out operation.

For the above reasons, in the memory transistor of the type just explained, too, it is more practicable to have the select transistor connected thereto in series. However, by having the select transistor formed above the memory transistor, it is possible to realize the memory cell whose occupying area can be the same as that without the select transistor.

In the above first embodiment and the second embodiment of the invention, the select transistor has been explained as being a thin film transistor formed in the polycrystalline silicon thin film. However, it should be noted that such transistor can, of course, be a thin film transistor of mono-crystalline silicon or other types of semiconductor thin film transistors.

As explained above, according to the invention, the select transistor connected to the memory transistor in series is formed above the memory transistor by a thin film transistor of polycrystalline silicon, so that the necessary space occupied by the memory cell is that of one transistor thereby enabling to make the overall memory cell smaller.

While the invention has been described in its preferred embodiments, it is to be understood that the words which have been used are words of description rather than limitation and that changes within the purview of the appended claims may be made without departing from the true scope and spirit of the invention in its broader aspects.

I claim:

1. A semiconductor non-volatile memory device comprising:
   a semiconductor substrate having a major surface;
   a memory transistor formed on the major surface of said semiconductor substrate and having a gate insulating film and a channel region; and
   a select transistor connected in series to said memory transistor and having a gate insulating film and a channel region, said select transistor being provided such that the gate insulating film and the channel region of said select transistor are overlapped with the gate insulating film and the channel region of said memory transistor in a direction perpendicular to the major surface of said semiconductor substrate.

2. A semiconductor non-volatile memory device according to claim 1, in which said memory transistor includes a floating gate.

3. A semiconductor non-volatile memory device according to claim 1, in which said memory transistor includes a plurality of gate insulating films.

4. A semiconductor non-volatile memory device according to claim 1, in which said memory transistor has a control gate that also serves as a select gate for said select transistor.

5. A semiconductor non-volatile memory device according to claim 1, in which said thin film transistor is one formed by a polycrystalline silicon thin film.

6. A semiconductor non-volatile memory device according to claim 1, in which said memory transistor has a drain diffusion layer connected to a source diffusion layer of said select transistor wherein said memory transistor and said select transistor are connected in series.

7. A semiconductor non-volatile memory device comprising:
   a semiconductor substrate having a major surface;
   a memory transistor formed on the major surface of said semiconductor substrate, said memory transistor having a source and a drain diffusion layer formed in a surface region of said semiconductor substrate, a floating gate provided on the major surface of said semiconductor substrate with a first gate insulating film being interposed, and a control gate provided on said floating gate with a second gate insulating film being interposed;
   an interlaid insulating film formed on said memory transistor; and
   a select transistor formed on said interlaid insulating film, said select transistor having a drain diffusion layer, a source diffusion layer which is connected in series to said drain diffusion layer of said memory transistor, and a select gate provided on said interlaid insulating film with a third gate insulating film being interposed, and said select transistor being overlapped with said memory transistor in a direction perpendicular to the major surface of said semiconductor substrate.

8. A semiconductor non-volatile memory device comprising:
   a semiconductor substrate having a major surface;
   a memory transistor formed on the major surface of said semiconductor substrate, said memory transistor having a source and a drain diffusion layer formed in a surface region of said semiconductor substrate, a floating gate provided on the major surface of said semiconductor substrate with a first gate insulating film being interposed, and a control gate provided on said floating gate with a second gate insulating film being interposed;
   an interlaid insulating film covering said floating gate and said control gate of said memory transistor except an upper surface of said control gate of said memory transistor; and
   a select transistor formed on said interlaid insulating film with a third gate insulating film being interposed, said select transistor having a drain diffusion layer, a source diffusion layer which is connected in series to said drain diffusion layer of said memory transistor, and a select gate which also serves as said control gate of said memory transistor, and said select transistor being overlapped with said memory transistor in a direction perpendicular to the major surface of said semiconductor substrate.

* * * * *

UNITED STATES PATENT AND TRADEMARK OFFICE
CERTIFICATE OF CORRECTION

PATENT NO.   :   5,267,195
DATED        :   November 30, 1993
INVENTOR(S)  :   Noriaki KODAMA It is certified that error appears in the above-identified patent and that said Letters Patent is hereby corrected as shown below:

Col. 2, line 66, delete "18" and insert --16--.

Signed and Sealed this

Twenty-third Day of August, 1994

Attest:

BRUCE LEHMAN

Attesting Officer

Commissioner of Patents and Trademarks